United States Patent [19]
Seok et al.

[11] Patent Number: 5,909,950
[45] Date of Patent: Jun. 8, 1999

[54] METHOD AND APPARATUS FOR TURNING ON AND OFF A LAMP IN A REFRIGERATOR

[75] Inventors: Jin-oh Seok, Suwon; Bong-cheon Jung, Pusan, both of Rep. of Korea

[73] Assignee: Samsung Electronics Co., Ltd., Suwon, Rep. of Korea

[21] Appl. No.: 08/914,149

[22] Filed: Aug. 19, 1997

[30] Foreign Application Priority Data

Aug. 20, 1996 [KR] Rep. of Korea ............ 96-34492

[51] Int. Cl.⁶ ............................................. F25D 27/00
[52] U.S. Cl. .................... 362/94; 362/92; 362/276; 362/802; 312/116
[58] Field of Search ........................ 362/92, 94, 276, 362/802; 312/116

[56] References Cited

U.S. PATENT DOCUMENTS

| | | | |
|---|---|---|---|
| 4,013,872 | 3/1977 | Glass | 219/497 |
| 5,337,581 | 8/1994 | Lott | 62/264 |
| 5,365,438 | 11/1994 | Mitchell | 364/424.03 |
| 5,779,347 | 3/1997 | Seok et al. | 362/94 |

*Primary Examiner*—Sandra O'Shea
*Assistant Examiner*—Marshall Honeyman
*Attorney, Agent, or Firm*—Burns, Doane, Swecker & Mathis, L.L.P.

[57] ABSTRACT

A refrigerator door handle carries a contact sensor which, when touched by user, causes an interior lamp of the refrigerator to be illuminated. Thereafter, the illumination of the lamp is controlled by a conventional switch which senses when the door is open or closed, whereby the lamp remains on until the door is sensed to be closed.

5 Claims, 4 Drawing Sheets

METHOD AND APPARATUS FOR TURNING ON AND OFF A LAMP IN A REFRIGERATOR

BACKGROUND OF THE INVENTION

1. Field of the Invention

The present invention relates to a method and apparatus for turning on and off a lamp installed in a refrigerator.

2. Description of the Related Art

A refrigerator generally includes a lamp for lighting the inside thereof as for a user to easily distinguish foods stored therein. The lamp is turned on when a door of the refrigerator is opened. Conversely, it is turned off when the door is closed.

A conventional method for turning on and off the lamp according to the state of the door will be described with reference to FIGS. 1 and 2.

FIG. 1 illustrates a conventional lamp turning on and off unit for turning on and off the lamp depending on the open and closed state of the door. As shown, the conventional lamp turning on and off unit includes a microcomputer 1 for performing a predetermined program. The microcomputer 1 is connected to a switch SW that is operated by the door of the refrigerator, and the microcomputer 1 is also connected to a lamp driving unit 2 for turning on and off the lamp L.

Referring to FIG. 2, the lamp L is controlled according to the operation of the switch SW which is turned on when the door of the refrigerator is opened and turned off when the door is closed. In other words the microcomputer 1 makes a determination as to whether the door is opened or closed depending upon a contact signal from the switch SW. When the door is opened, i.e., if it is determined that the switch SW is on, the microcomputer 1 causes the lamp to be turned on by means of the lamp driving unit 2. Otherwise, when the door is closed. i.e., if it is determined that the switch SW is off, the microcomputer 1 causes the lamp to be turned off through the lamp driving, unit 2.

According to the aforementioned conventional method, the switch SW is actually turned on when the door is nearly half opened. Thus some amount of time is delayed for the microcomputer 1 to recognize that the door is opened. Moreover, such a lamp driving unit is generally composed of a relay circuit. Accordingly, another amount of time may be taken for a relay contact point to be operated after the microcomputer 1 commands the lamp to be turned on.

As a result, the user has felt inconvenience in use of the refrigerator because the lamp is not turned on when he opens the door of the refrigerator. In particular, a fluorescent lamp that is more widely used for the refrigerator than a glow lamp also causes a delay. The fluorescent lamp rarely influences temperature in the refrigerator, however requires more time to be illuminated when compared to the glow lamp.

SUMMARY OF THE INVENTION

The present invention has been made to overcome the above described inconvenience. It is therefore an object of the present invention to provide a method and apparatus for causing a lamp in a refrigerator to be turned on before a door of the refrigerator is opened by a user.

The method for turning on and off a lamp of a refrigerator comprises the steps of:(a) determining whether a user touches a sensor mounted on an exterior of a door of the refrigerator; (b) turning on the lamp of the refrigerator if it is determined that the user touches the sensor; (c) determining, subsequent to step (b), whether the door is opened; and (d) maintaining the lamp in its on-state if it is determined that the door is open, and turning off the lamp if it is determined that the door is closed.

Preferably, if it is determined that the door of the refrigerator is not touched by the user, the lamp is turned on and off depending on whether the door is open or closed.

The apparatus for turning on and off a lamp of a refrigerator comprises: a body defining a refrigerating compartment, a door for closing the compartment, a lamp disposed in the compartment; a switch which is turned on and off by a door of the refrigerator; a sensing unit on an exterior of the door for sensing when a user touches the door of the refrigerator; and a microcomputer for turning on the lamp when it is sensed by the sensing unit that the door is touched by the user, and after the lamp is turned on, controlling the lamp driving unit to maintain the lamp in an on-state or to turn off the lamp, depending upon a signal from the switch.

Preferably, the sensing unit includes: a contact sensor which is mounted at a predetermined position on the door of the refrigerator, and generates a predetermined signal after sensing whether a user touches the door; and a square wave generator which generates a square wave responding to the signal from the contact sensor and transmits the square wave to the microcomputer.

Preferably, the lamp comprises a fluorescent lamp.

BRIEF DESCRIPTION OF THE DRAWINGS

The above object and other advantages of the present invention will become more apparent by describing in detail the preferred embodiment thereof with reference to the attached drawings, in which.

DETAILED DESCRIPTION OF THE PREFERRED EMBODIMENT

A preferred embodiment of the present invention will be described in detail, referring to the accompanying drawings.

Figure 1:
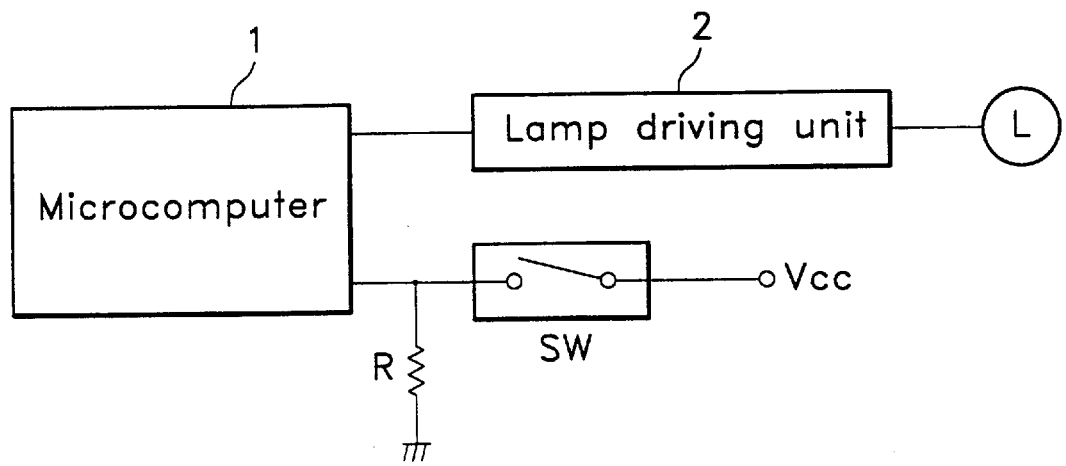
FIG. 1 is a circuit diagram of a conventional lamp actuating unit for turning on and off a lamp of a refrigerator.
Figure 2:
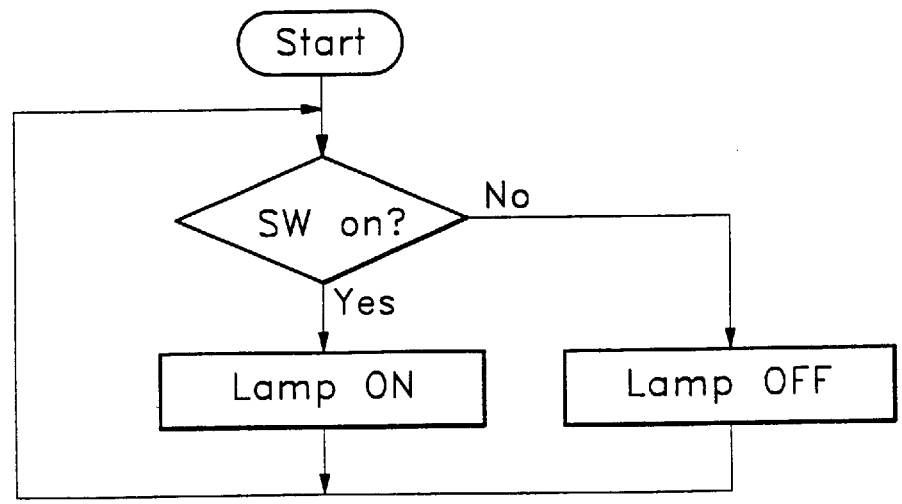
FIG. 2 is a flow chart of a conventional method for turning on and off a lamp of a refrigerator.
Figure 3:
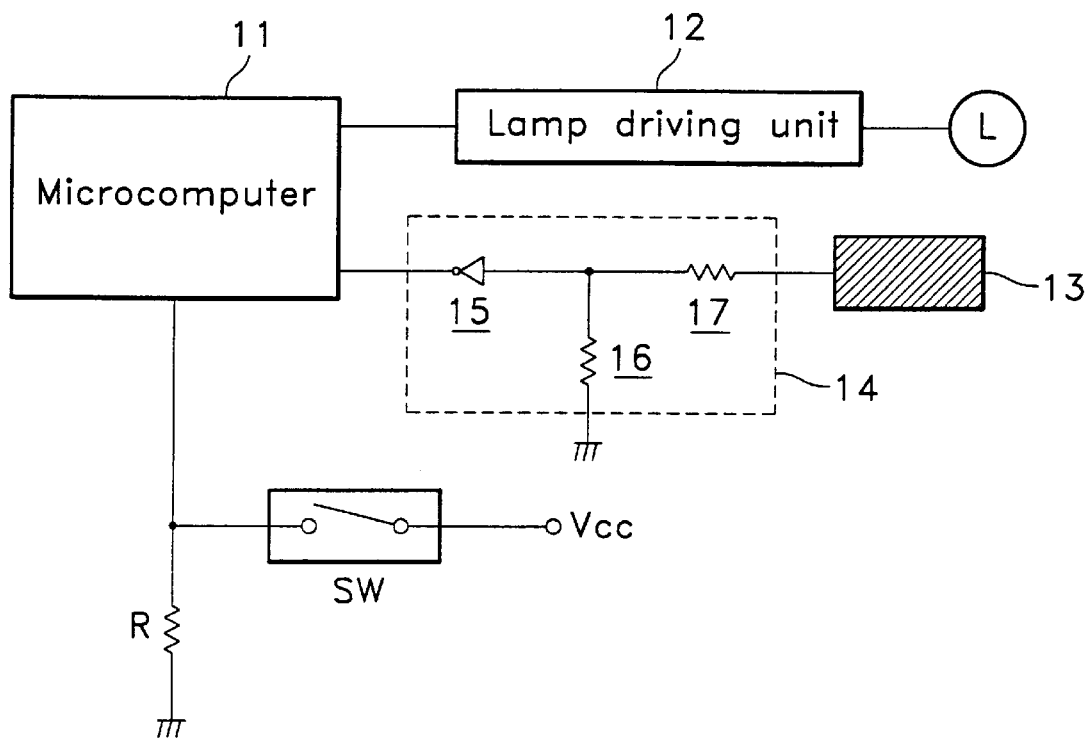
FIG. 3 is a circuit diagram of an apparatus for turning on and off a lamp of a refrigerator according to the present invention.
Figure 6:
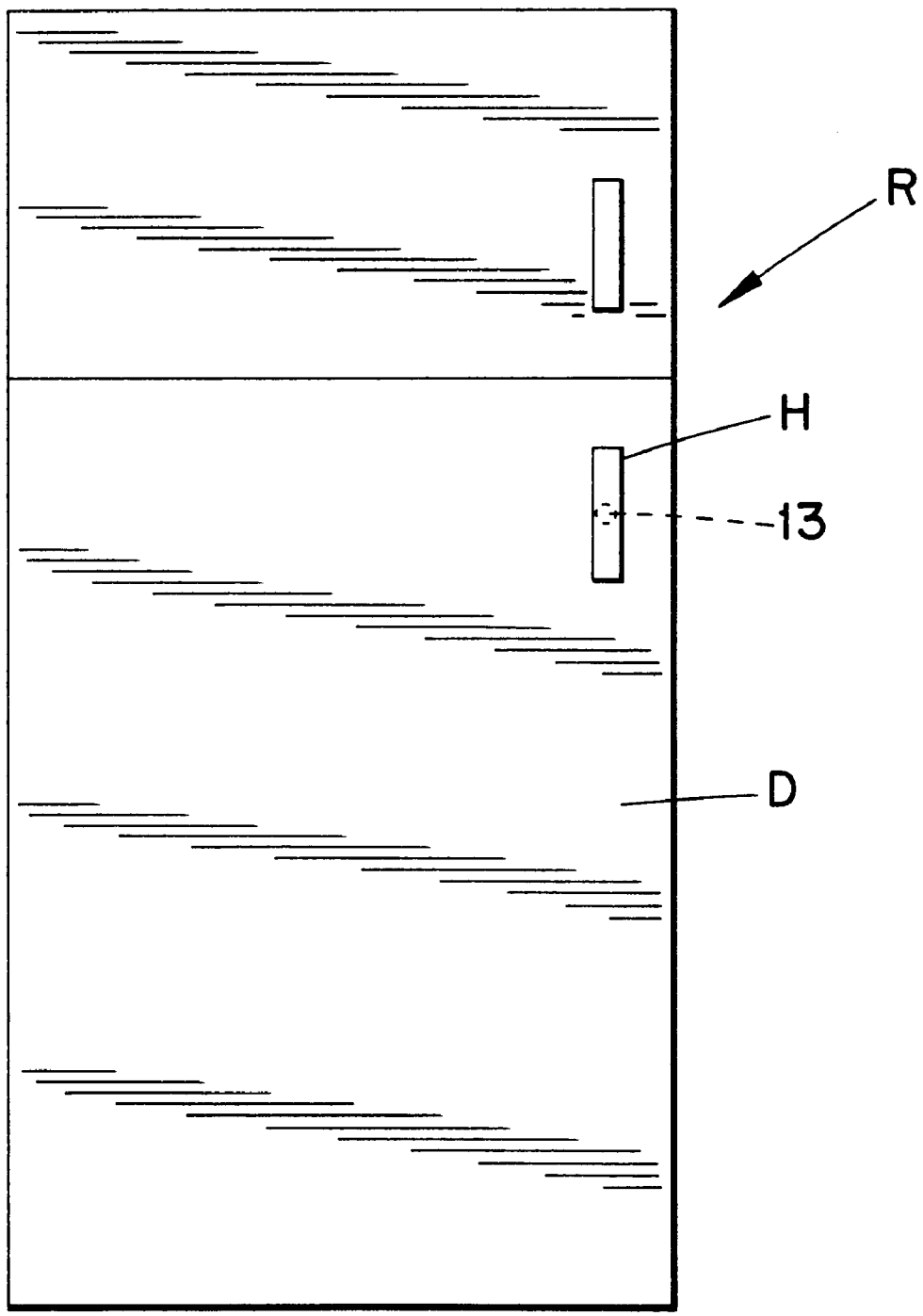
FIG. 6 is a schematic front view of a refrigerator having a sensor, according to the present invention.

Referring to FIG. 3 and 6, an apparatus for turning on and off a lamp of a refrigerator R according to the present invention includes: a microcomputer 11; a lamp driving unit 12 for turning on and off the lamp L; a switch SW which is operated by a door D of the refrigerator; a contact sensor 13 for sensing when a user touches the door; and a square wave generator 14 which generates a square wave responding to a signal generated from the contact sensor 13 and transmits the square wave to the microcomputer 11. Preferably, the square wave generator 14 includes a buffer 15 and resistors 16 and 17.

Figure 4A:
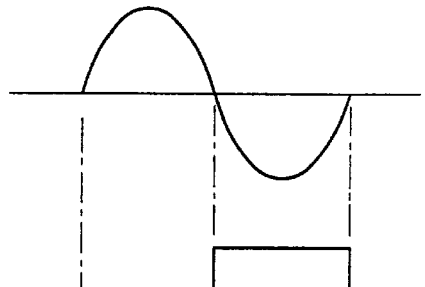
FIG. 4A is a signal wave form generated by a contact sensor used in a method for turning on and off a lamp of a refrigerator according to the present invention.
Figure 4B:
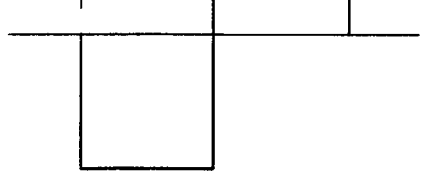
FIG. 4B is a signal wave form generated by a square wave generator used in a method for turning on and off a lamp of a refrigerator according to the present invention.

The contact sensor 13 and the square wave generator 14 sense whether the user touches the door of the refrigerator, and send the result from the sensing step to the microcomputer 11. For example, the contact sensor 13 is mounted to a door knob or handle H of the door of the refrigerator and generates an alternating current signal as shown in FIG. 4A when touched by a hand of the user. The square wave generator 14 generates a square wave as shown in FIG. 4B responding to the alternating current signal.

The microcomputer 11 controls the lamp driving unit 12 to turn on the lamp L responding to a signal from the switch SW, which is basically the same as a conventional lamp turning on and off method. Furthermore, the microcomputer 11 controls the lamp L by performing a predetermined program to turn on the lamp L even when a square wave signal is generated in the square wave generator 14.

Figure 5:
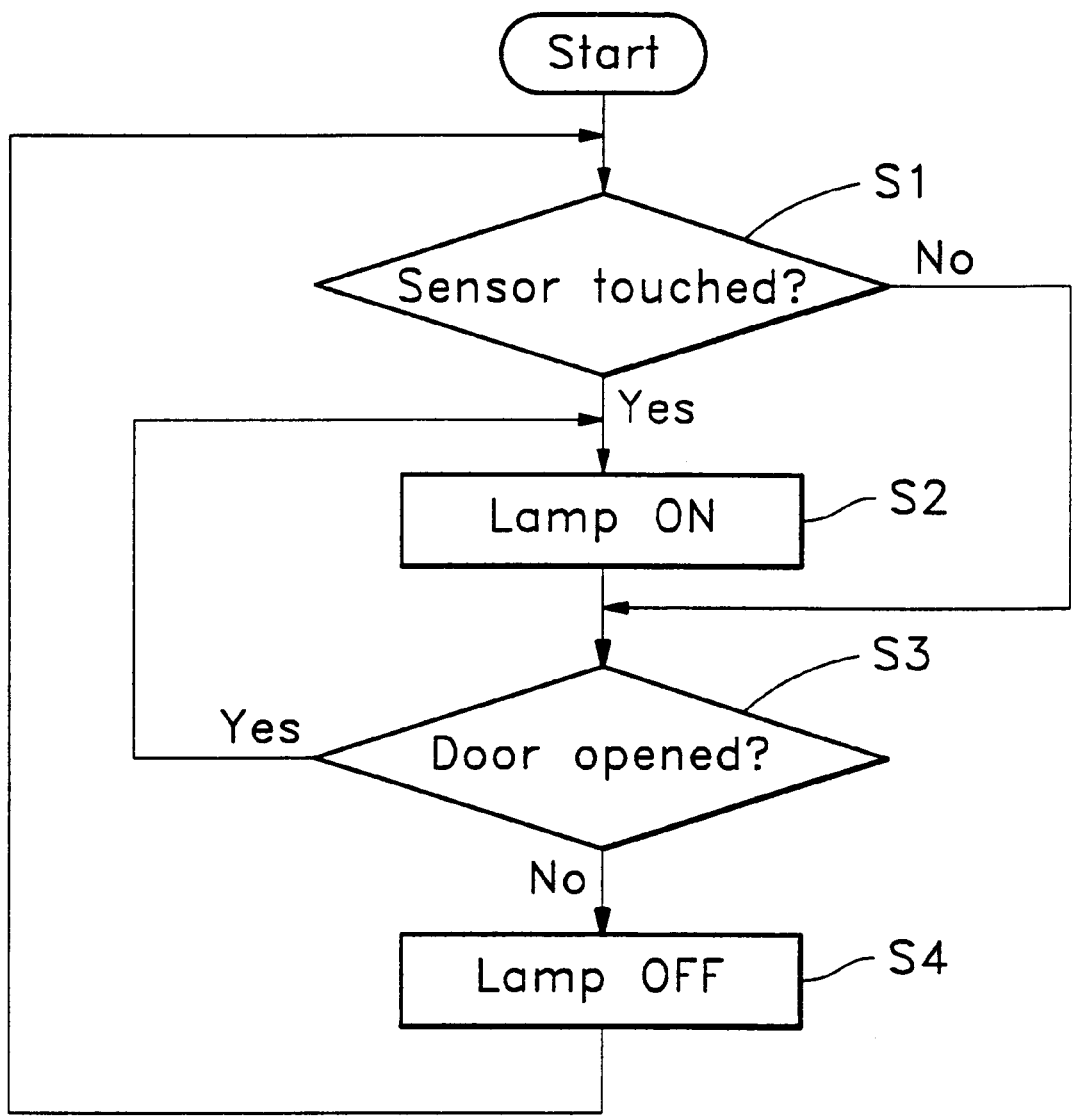
FIG. 5 is a flow chart of a method for turning on and off a lamp of a refrigerator according to the present invention.

The method for turning on and off a lamp of a refrigerator according to the present invention will be described in detail referring to FIG. 5.

First, at step S1, a determination is made as to whether or not the user touches a contact sensor 13 which is, for example mounted on a door knob of a door of the refrigerator. In other words, when the user touches the door knob to open the door, a signal as shown in FIG. 4A is generated from the contact sensor 13 of FIG. 3 which is mounted on the door knob. Responding to the signal from the contact sensor 13, the square wave generator 14 generates a square wave signal as shown in FIG. 4B at the same time. At this time, the microcomputer 11 senses the square wave signal, thereby determining that the user has touched the door of the refrigerator.

The microcomputer 11 then commands the lamp driving unit 12 to turn on the lamp L based on the square wave signal. According to the command from the microcomputer 11, the lamp driving unit 12 is operated. As a result, the lamp L is turned on at step S2.

After the lamp L is turned on it is determined whether the door of the refrigerator is opened or not at step S3. The determination is made based on an on and off state of the switch SW that is turned on and off associated with the door of the refrigerator, which is basically the same as the conventional method. At this time, the determination as to whether the door of the refrigerator is opened or not, is made under the condition that the determination of step S2 as to whether the user has touched the door of the refrigerator or not has already been made.

If it is determined that the door is opened, the process returns to step S2 and the microcomputer 11 maintains the lamp L in its on-state. Otherwise, if it is determined that the door is closed, the microcomputer 11 commands the lamp driving unit 12 to turn off the lamp L. According to the command of the microcomputer 11, the lamp driving unit 12 turns off the lamp L at step S4.

Consequently, the lamp installed in the refrigerator is turned on when the user touches the door knob of the door of the refrigerator to open the door, and is maintained in its on-state if the door is opened under this condition.

Even when the door is opened under the condition that it is not sensed that the user touches the door knob, the lamp is turned on by the signal of the switch SW. Accordingly, it is possible to prevent a malfunction which may be caused when the user opens the door of the refrigerator by touching a portion of the door not having the contact sensor, or when the contact sensor is out of order.

On the other hand, in the event that the user breaks contact with the door after the user touches the door of the refrigerator to thereby turn on the lamp (i.e., the user does not open the door), the lamp is turned off right after it is determined that the door is not opened. Therefore, there is no problem of power consumption in association with a malfunction.

As aforementioned, according to the present invention, the lamp in the refrigerator is turned on before the door of the refrigerator is opened. Accordingly the user does not need to wait until the lamp is turned on after opening the door of the refrigerator. In this respect, the present invention provides the user with a convenience in use of the refrigerator, particularly in a refrigerator accommodating a fluorescent lamp which rarely influences temperature in the refrigerator, by removing a delay in the point of time that the lamp is illuminated after the door of the refrigerator is opened.

This invention has been described above with reference to the aforementioned embodiment. It is evident, however, that many alternative modifications and variations will be apparent to those skilled in the art in light of the foregoing description. Accordingly, it is intended to embrace all such alternatives, modifications and variations as fall within the spirit and scope of the appended claims.

What I claim is:

1. A method for turning on and off a lamp disposed inside of a refrigerator, comprising the steps of:
    (a) determining whether a user touches a sensor mounted on an exterior of a door of the refrigerator;
    (b) turning on a fluorescent lamp of the refrigerator if it is determined that the user touches the sensor;
    (c) determining, subsequent to step b, whether the door is opened; and
    (d) maintaining the lamp in an on-state if it is determined in step C that the door is open, and turning off the lamp if it is determined in step C that the door is closed.

2. A method according to claim 1, wherein if it is determined that the user has not touched the sensor in step (a), the lamp is turned on if the door is sensed as open in step (c) and is turned off if the door is sensed as closed in step (c).

3. A refrigerator comprising:
    a body defining a refrigerating compartment;
    a door mounted on the body for opening and closing the compartment;
    a fluorescent lamp disposed in the compartment;
    a sensor unit mounted on an exterior of the door and actuable in response to being touched by a user;
    a switch arranged to be actuated by the door for indicating when the door is open; and
    a microcomputer connected to the lamp, the sensor unit, and the switch for illuminating the lamp in response to the sensor being touched by a user and thereafter maintaining the lamp illuminated while the door is open.

4. A refrigerator according to claim 3 wherein the door exterior includes a handle, the sensor mounted on the handle.

5. A refrigerator according to claim 3 wherein the sensor unit comprises a contact sensor for generating an electrical signal in response to being touched by a user, and a square wave generator connected to the contact sensor and to the microcomputer for generating a square wave in response to receiving the electrical signal from the contact sensor and transmitting the square wave to the microcomputer.

* * * * *